United States Patent
Ikeya et al.

(10) Patent No.: US 9,583,526 B2
(45) Date of Patent: Feb. 28, 2017

(54) SOLID-STATE IMAGE PICKUP ELEMENT AND SOLID-STATE IMAGE PICKUP ELEMENT MOUNTING STRUCTURE

(75) Inventors: Tomohiro Ikeya, Hamamatsu (JP); Toshiyuki Fukui, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/116,852

(22) PCT Filed: Jun. 19, 2012

(86) PCT No.: PCT/JP2012/065640
§ 371 (c)(1),
(2), (4) Date: Nov. 11, 2013

(87) PCT Pub. No.: WO2013/035410
PCT Pub. Date: Mar. 14, 2013

(65) Prior Publication Data
US 2014/0091421 A1  Apr. 3, 2014

(30) Foreign Application Priority Data
Sep. 5, 2011  (JP) ................... 2011-192938

(51) Int. Cl.
*H01L 27/146* (2006.01)
*H01L 23/00* (2006.01)

(52) U.S. Cl.
CPC ........ *H01L 27/14636* (2013.01); *H01L 24/06* (2013.01); *H01L 27/14618* (2013.01);
(Continued)

(58) Field of Classification Search
CPC ................... H01L 27/1464; H01L 27/14806
(Continued)

(56) References Cited

U.S. PATENT DOCUMENTS

2006/0125038 A1  6/2006  Mabuchi
2009/0243022 A1  10/2009  Mabuchi
(Continued)

FOREIGN PATENT DOCUMENTS

CN  1778103 A  5/2006
CN  101490844  7/2009
(Continued)

OTHER PUBLICATIONS

JP 2006041343A Partial Translation downloaded Sep. 1, 2014.*
(Continued)

*Primary Examiner* — Thomas L Dickey
(74) *Attorney, Agent, or Firm* — Drinker Biddle & Reath LLP

(57) ABSTRACT

A solid-state image pickup element is provided with a semiconductor substrate having a photosensitive region, a plurality of first electrode pads arrayed on a principal face of the semiconductor substrate, a plurality of second electrode pads arrayed in a direction along a direction in which the plurality of first electrode pads are arrayed, on the principal face of the semiconductor substrate, and a plurality of interconnections connecting the plurality of first electrode pads and the plurality of second electrode pads in one-to-one correspondence. The plurality of interconnections connect the first and second electrode pads so that each interconnection connects the first electrode pad and the second electrode pad in a positional relation of line symmetry with respect to a center line perpendicular to the array directions of the plurality of first and second electrode pads.

12 Claims, 17 Drawing Sheets

(52) U.S. Cl.
CPC .............. *H01L 24/05* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/02373* (2013.01); *H01L 2224/02375* (2013.01); *H01L 2224/0401* (2013.01); *H01L 2224/04042* (2013.01); *H01L 2224/04073* (2013.01); *H01L 2224/05548* (2013.01); *H01L 2224/05553* (2013.01); *H01L 2224/05555* (2013.01); *H01L 2224/0603* (2013.01); *H01L 2224/06051* (2013.01); *H01L 2224/06135* (2013.01); *H01L 2224/16225* (2013.01); *H01L 2224/32225* (2013.01); *H01L 2224/4824* (2013.01); *H01L 2224/48091* (2013.01); *H01L 2224/48227* (2013.01); *H01L 2224/49175* (2013.01); *H01L 2224/73204* (2013.01); *H01L 2224/73265* (2013.01); *H01L 2924/15151* (2013.01); *H01L 2924/15192* (2013.01); *H01L 2924/16195* (2013.01); *H01L 2924/19107* (2013.01)

(58) Field of Classification Search
USPC .......................................... 257/447, E27.131
See application file for complete search history.

(56) References Cited

U.S. PATENT DOCUMENTS

| 2009/0243024 | A1* | 10/2009 | Yoneta | .............. H01L 27/14618 257/459 |
|---|---|---|---|---|
| 2010/0127342 | A1 | 5/2010 | Mabuchi | |
| 2011/0084317 | A1 | 4/2011 | Mabuchi | |
| 2011/0084351 | A1 | 4/2011 | Mabuchi | |
| 2011/0084352 | A1 | 4/2011 | Mabuchi | |
| 2011/0086463 | A1 | 4/2011 | Mabuchi | |
| 2011/0248373 | A1 | 10/2011 | Mabuchi | |
| 2014/0038342 | A1 | 2/2014 | Mabuchi | |

FOREIGN PATENT DOCUMENTS

| CN | 101546118 | | 9/2009 |
|---|---|---|---|
| EP | 1152448 | A1 | 11/2001 |
| EP | 1 553 390 | | 7/2005 |
| EP | 2 043 153 | | 4/2009 |
| JP | S62-142349 | A | 6/1987 |
| JP | H01-303747 | A | 12/1989 |
| JP | H06-45574 | A | 2/1994 |
| JP | H10-107255 | A | 4/1998 |
| JP | 2004-177217 | A | 6/2004 |
| JP | 2006-041343 | A | 2/2006 |
| JP | 2006-173351 | A | 6/2006 |
| JP | 2009-238819 | A | 10/2009 |
| JP | 2009-295821 | A | 12/2009 |
| KR | 10-2006-0067872 | | 6/2006 |
| KR | 10-2009-0029189 | | 3/2009 |
| KR | 10-2009-0102642 | | 9/2009 |
| TW | 278108 | | 6/1996 |
| TW | 200945414 | | 11/2009 |
| WO | WO 2007/117799 | | 10/2007 |
| WO | WO-2008/007613 | A1 | 1/2008 |

OTHER PUBLICATIONS

English-language translation of International Preliminary Report on Patentability (IPRP) dated Mar. 20, 2014 that issued in WO Patent Application No. PCT/JP2012/065640.

Office Action issued Oct. 11, 2016 in European Patent Application No. 12830624.8.

* cited by examiner

SOLID-STATE IMAGE PICKUP ELEMENT AND SOLID-STATE IMAGE PICKUP ELEMENT MOUNTING STRUCTURE

TECHNICAL FIELD

The present invention relates to a solid-state image pickup element and a solid-state image pickup element mounting structure.

BACKGROUND ART

A known solid-state image pickup element is a so-called front-illuminated solid-state image pickup element provided with a semiconductor substrate having a sensitive region, and a plurality of electrode pads arrayed on a principal face of the semiconductor substrate, wherein the principal face side of the semiconductor substrate is a light receiving surface side (e.g., cf. Patent Literature 1). Another known solid-state image pickup element is a so-called back-illuminated solid-state image pickup element provided with a semiconductor substrate having a sensitive region, and a plurality of electrode pads arrayed on a principal face of the semiconductor substrate, wherein the back face side to the principal face of the semiconductor substrate is a light receiving surface side (e.g., cf. Patent Literature 2).

CITATION LIST

Patent Literatures

Patent Literature 1: Japanese Patent Application Laid-Open Publication No. H10-107255
Patent Literature 2: Japanese Patent Application Laid-Open Publication No. H06-045574

SUMMARY OF INVENTION

Technical Problem

In comparison between the foregoing front-illuminated solid-state image pickup element and back-illuminated solid-state image pickup element, a surface of the former to be opposed to a mounting member (e.g., a wiring substrate or the like) on which the solid-state image pickup element is to be mounted is reverse to that of the latter and an arrangement of the electrode pads arrayed on the principal face of the semiconductor substrate in the former is also reverse to that in the latter. If the front-illuminated solid-state image pickup element and back-illuminated solid-state image pickup element are intended to be mounted on the mounting member of the same structure, an arrangement of output terminals of the mounting member to be electrically connected to the electrode pads in the former solid-state image pickup element will be also reverse to that in the latter. For this reason, it is necessary to prepare two types of external circuits (e.g., drive circuits or the like) to be connected to the solid-state image pickup element through the mounting member, according to the arrangements of output terminals of the mounting member.

For adopting a common external circuit to the front-illuminated solid-state image pickup element and the back-illuminated solid-state image pickup element, the same arrangement of output terminals must be used for the front-illuminated solid-state image pickup element and the back-illuminated solid-state image pickup element. This requires us to prepare the mounting member for the front-illuminated solid-state image pickup element and the mounting member for the back-illuminated solid-state image pickup element. In either case, we need to prepare two types of external circuits or mounting members or the like, which leads to increase in cost and preparatory period of the external circuits or the mounting members or the like.

It is an object of the present invention to provide a solid-state image pickup element and a solid-state image pickup element mounting structure allowing easy reduction of the cost and preparatory period of the external circuit or the mounting member or the like.

Solution to Problem

An aspect of the present invention is a solid-state image pickup element comprising: a semiconductor substrate having a photosensitive region; a plurality of first electrode pads arrayed on a principal face of the semiconductor substrate; a plurality of second electrode pads arrayed in a direction along a direction in which the plurality of first electrode pads are arrayed, on the principal face of the semiconductor substrate; and a plurality of interconnections connecting the plurality of first electrode pads and the plurality of second electrode pads in one-to-one correspondence, wherein the plurality of interconnections connect the first and second electrode pads so that each interconnection connects the first electrode pad and the second electrode pad in a positional relation of line symmetry with respect to a center line perpendicular to the array directions of the plurality of first and second electrode pads.

In the present invention, the first electrode pad and the second electrode pad in the positional relation of line symmetry with respect to the center line perpendicular to the array directions of the plurality of first and second electrode pads are connected through the interconnection. Therefore, even with reversal of the principal face and the back face to this principal face, the positions of the first electrode pad and the second electrode pad connected to each other through the interconnection are the same in the array directions of the respective electrode pads.

In comparison between a case where this solid-state image pickup element is mounted on a mounting member with the principal face being opposite thereto and a case where the solid-state image pickup element is mounted on the mounting member with the back face to the principal face being opposite thereto, there is no reversal of the positional relation of terminals of the mounting member to be electrically connected to the first electrode pads or to the second electrode pads. As a result, there is no need for preparing two types of external circuits such as the drive circuits and no need for preparing two types of mounting members, either. Therefore, the present invention allows easy reduction of the cost and preparatory period of the external circuit or the mounting member or the like.

The plurality of first electrode pads may be located nearer to an edge of the semiconductor substrate than the plurality of second electrode pads are. In this case, the connection by wire bonding to each first electrode pad becomes easier when the solid-state image pickup element is mounted on the mounting member with the back face to the principal face being opposite thereto.

Another aspect of the present invention is a solid-state image pickup element comprising: a semiconductor substrate of a rectangular shape having a photosensitive region; a plurality of first electrode pads arrayed in a first direction along one side of the semiconductor substrate, on a principal face of the semiconductor substrate; a plurality of second electrode pads arrayed in the first direction on the principal face of the semiconductor substrate; and a plurality of interconnections connecting the plurality of first electrode pads and the plurality of second electrode pads in one-to-one correspondence, wherein the plurality of interconnections connect the first and second electrode pads so that each interconnection connects the first electrode pad and the second electrode pad in an identical order relation in an array order in the first direction among the plurality of first electrode pads and in an array order in a second direction opposite to the first direction among the plurality of second electrode pads.

In the present invention, the first electrode pad and the second electrode pad in the same order relation in the array order in the first direction among the plurality of first electrode pads and in the array order in the second direction among the plurality of second electrode pads are connected through the interconnection. Therefore, even with reversal of the principal face of the semiconductor substrate and the back face to this principal face, the positions of the first electrode pad and the second electrode pad connected to each other through the interconnection are the same in the array orders of the respective electrode pads.

In comparison between a case where this solid-state image pickup element is mounted on a mounting member with the principal face being opposite thereto and a case where the solid-state image pickup element is mounted on the mounting member with the back face to the principal face being opposite thereto, there is no reversal of the positional relation of terminals of the mounting member to be electrically connected to the first electrode pads or to the second electrode pads. As a result, there is no need for preparing two types of external circuits such as the drive circuits and no need for preparing two types of mounting members, either. Therefore, the present invention allows easy reduction of the cost and preparatory period of the external circuit or the mounting member or the like.

The plurality of first electrode pads may be located nearer to the aforementioned one side of the semiconductor substrate than the plurality of second electrode pads are. In this case, the connection by wire bonding to each first electrode pad becomes easier when the solid-state image pickup element is mounted on the mounting member with the back face to the principal face being opposite thereto.

The semiconductor substrate may have a light receiving surface side defined on the principal face side and the semiconductor substrate may have a light receiving surface side defined on the back face side to the principal face. When the principal face side is the light receiving surface side, the front-illuminated solid-state image pickup element is realized. When the back face side to the principal face is the light receiving surface side, the back-illuminated solid-state image pickup element is realized.

Still another aspect of the present invention is a solid-state image pickup element mounting structure comprising: the aforementioned solid-state image pickup element; and a mounting member on which the solid-state image pickup element is mounted and in which a plurality of third electrode pads are arranged on a principal face thereof, wherein the solid-state image pickup element is mounted on the mounting member so that the back face to the principal face of the solid-state image pickup element is opposite to the principal face of the mounting member, and wherein the plurality of first electrode pads and the plurality of third electrode pads are connected by wire bonding.

Another aspect of the present invention is a solid-state image pickup element mounting structure comprising: the foregoing solid-state image pickup element; and a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to the principal face of the mounting member, and wherein the plurality of second electrode pads and the plurality of third electrode pads are connected by flip chip bonding.

Another aspect of the present invention is a solid-state image pickup element mounting structure comprising: the foregoing solid-state image pickup element; and a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to a back face to the principal face of the mounting member, and wherein the plurality of second electrode pads and the plurality of third electrode pads are connected by wire bonding.

With any one of the solid-state image pickup element mounting structures, there is no need for preparing two types of external circuits or mounting members or the like, as described above. Therefore, the present invention allows easy reduction of the cost and preparatory period of the external circuit or the mounting member or the like.

Advantageous Effect of Invention

The present invention provides the solid-state image pickup elements and the solid-state image pickup element mounting structures allowing easy reduction of the cost and preparatory period of the external circuit or the mounting member or the like.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

Figure 1:
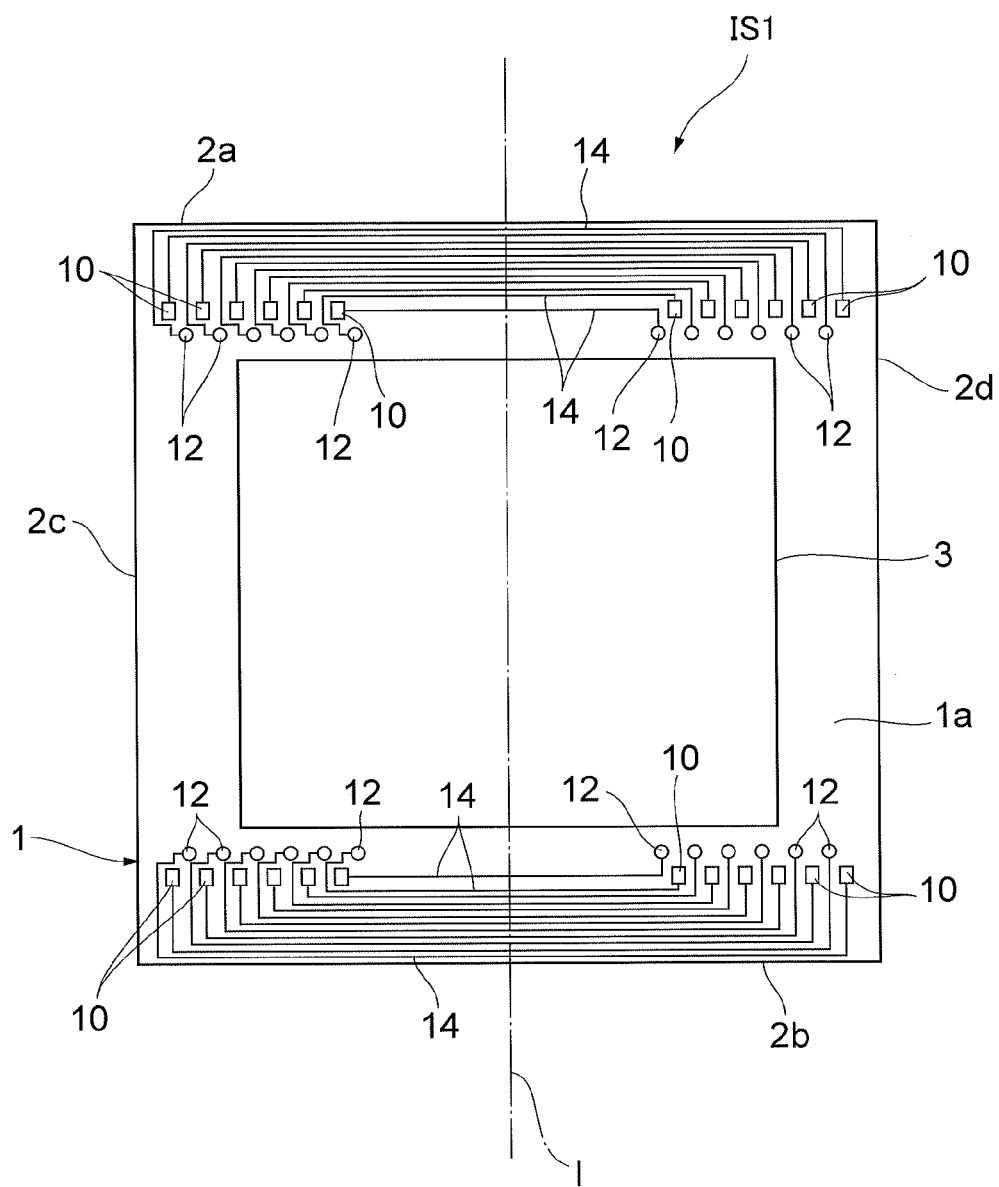
FIG. 1 is a plan view showing a front-illuminated solid-state image pickup element according to an embodiment of the present invention.
Figure 2:
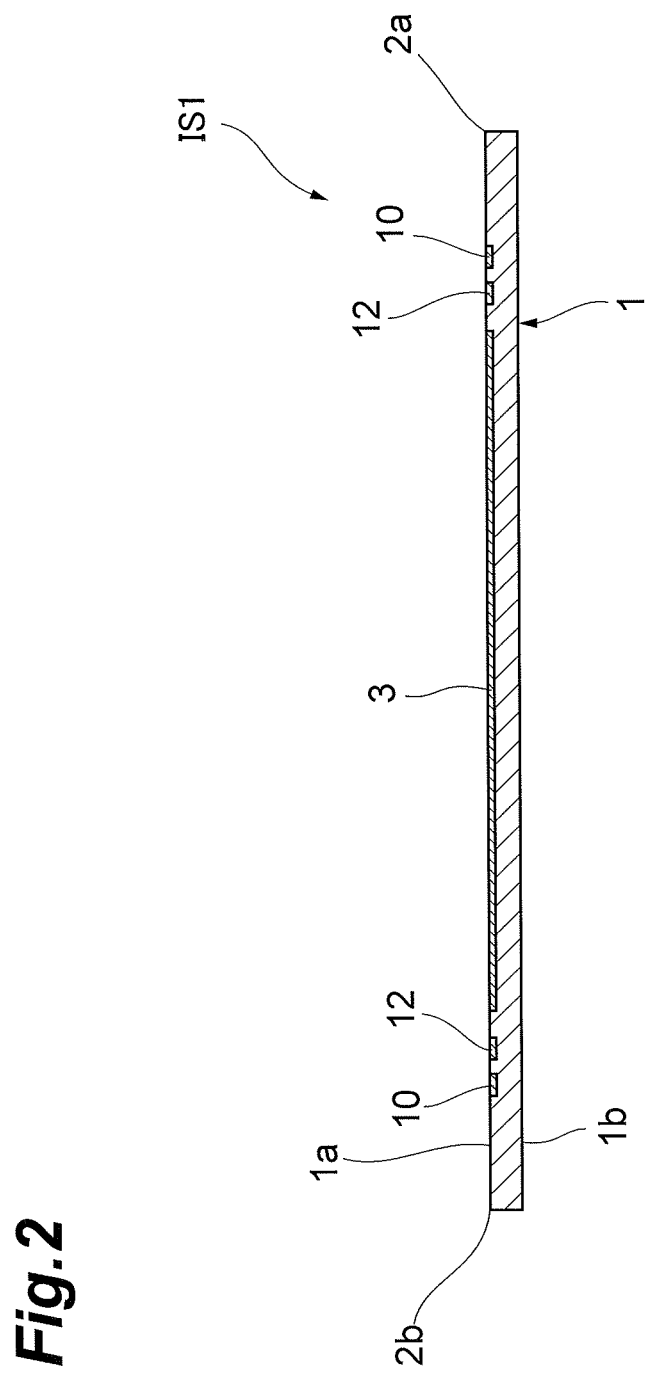
FIG. 2 is a drawing illustrating a cross-sectional configuration of the front-illuminated solid-state image pickup element according to the embodiment.

First, a configuration of a front-illuminated solid-state image pickup element IS1 according to an embodiment of the present invention will be described with reference to FIGS. 1 and 2. FIG. 1 is a plan view showing the front-illuminated solid-state image pickup element according to the present embodiment. FIG. 2 is a drawing illustrating a cross-sectional configuration of the front-illuminated solid-state image pickup element according to the present embodiment.

The front-illuminated solid-state image pickup element IS1, as shown in FIGS. 1 and 2, is provided with a semiconductor substrate 1, a plurality of first electrode pads 10, a plurality of second electrode pads 12, and a plurality of interconnections 14. The solid-state image pickup element IS1 is a so-called FI (Front-Illuminated)-CCD image sensor. The illustration of the interconnections 14 is omitted from FIG. 2.

The semiconductor substrate 1 has a rectangular shape on the plane view and has four sides 2a-2d constituting the edge of the semiconductor substrate 1. The semiconductor substrate 1 includes principal faces 1a, 1b opposed to each other. The semiconductor substrate 1 has a photosensitive region (image pickup region) 3 formed on the principal face 1a side. In the photosensitive region 3, a CCD for image pickup consisting of a plurality of vertical shift registers (not shown) is formed as pixels. In the solid-state image pickup element IS1, the principal face 1a side is a light receiving surface side. FIG. 1 is the plan view of the solid-state image pickup element IS1 as viewed from the light receiving surface (principal face 1a) side.

A light image incident on the photosensitive region 3 is converted into a two-dimensional electric charge image and electric charges are transferred along the vertical direction by the vertical shift registers. A horizontal shift register (not shown) is provided at an end in the charge transfer direction of the photosensitive region 3. The electric charges of the respective pixels having been transferred in the vertical direction are sequentially transferred along the horizontal direction by the horizontal shift register. The charge transfer method of the CCD may be a known method such as the frame transfer method, the interline transfer method, or the full frame transfer method.

Each first electrode pad 10 is arranged on the principal face 1a of the semiconductor substrate 1. Each first electrode pad 10 is provided in one of regions near to the two opposed sides 2a, 2b with the photosensitive region 3 in between the first electrode pads 10. In the present embodiment, twelve first electrode pads 10 are provided in each of the regions near to the respective sides 2a, 2b. Namely, there are twenty four first electrode pads 10 provided. The first electrode pads 10 each are arrayed in a direction along the sides 2a, 2b of the semiconductor substrate 1. The first electrode pads 10 have a rectangular shape.

Each second electrode pad 12 is also arranged on the principal face 1a of the semiconductor substrate 1. Each second electrode pad 12 is provided in one of the regions near to the foregoing two sides 2a, 2b and they are arrayed in the direction along the sides 2a, 2b of the semiconductor substrate 1 as the first electrode pads 10 are. In the present embodiment, twelve second electrode pads 12 are provided in each of the regions near to the respective sides 2a, 2b. Namely, there are twenty four second electrode pads 12 provided. The second electrode pads 12 have a circular shape. The first electrode pads 10 are located nearer to the edge of the semiconductor substrate 1 or nearer to the sides 2a, 2b than the second electrode pads 12 are.

The first electrode pads 10 and the second electrode pads 12 are arranged in zigzag patterns. The first electrode pads 10 and the second electrode pads 12 each include electrode pads for applying a transfer voltage to charge transfer electrodes for transferring electric charges in the vertical direction, an electrode pad for applying a transfer voltage to a charge transfer electrode for transferring electric charges in the horizontal direction, an electrode pad for reading out the electric charges having been transferred in the horizontal direction, an electrode pad for extracting outputs, an electrode pad for execution of a test operation, and so on.

Each interconnection 14, as shown in FIG. 1, is provided on the semiconductor substrate 1 and connects the first electrode pad 10 and the second electrode pad 12 in one-to-one correspondence. Each interconnection 14 connects the first electrode pad 10 and the second electrode pad 12 in a positional relation of line symmetry with respect to a center line 1 perpendicular to the array directions of the first and second electrode pads 10, 12. Namely, each interconnection 14 connects the first electrode pad 10 and the second electrode pad 12 in an identical order relation in an array order in a first direction (e.g., a direction from the side 2c to the side 2d) along the side 2a (or the side 2b) among the first electrode pads 10 and in an array order in a second direction (e.g., a direction from the side 2d to the side 2c) opposite to the first direction among the second electrode pads 12. FIG. 1 is drawn without the illustration of interconnections electrically connecting the photosensitive region 3 and each of the electrode pads 10, 12.

Figure 3:
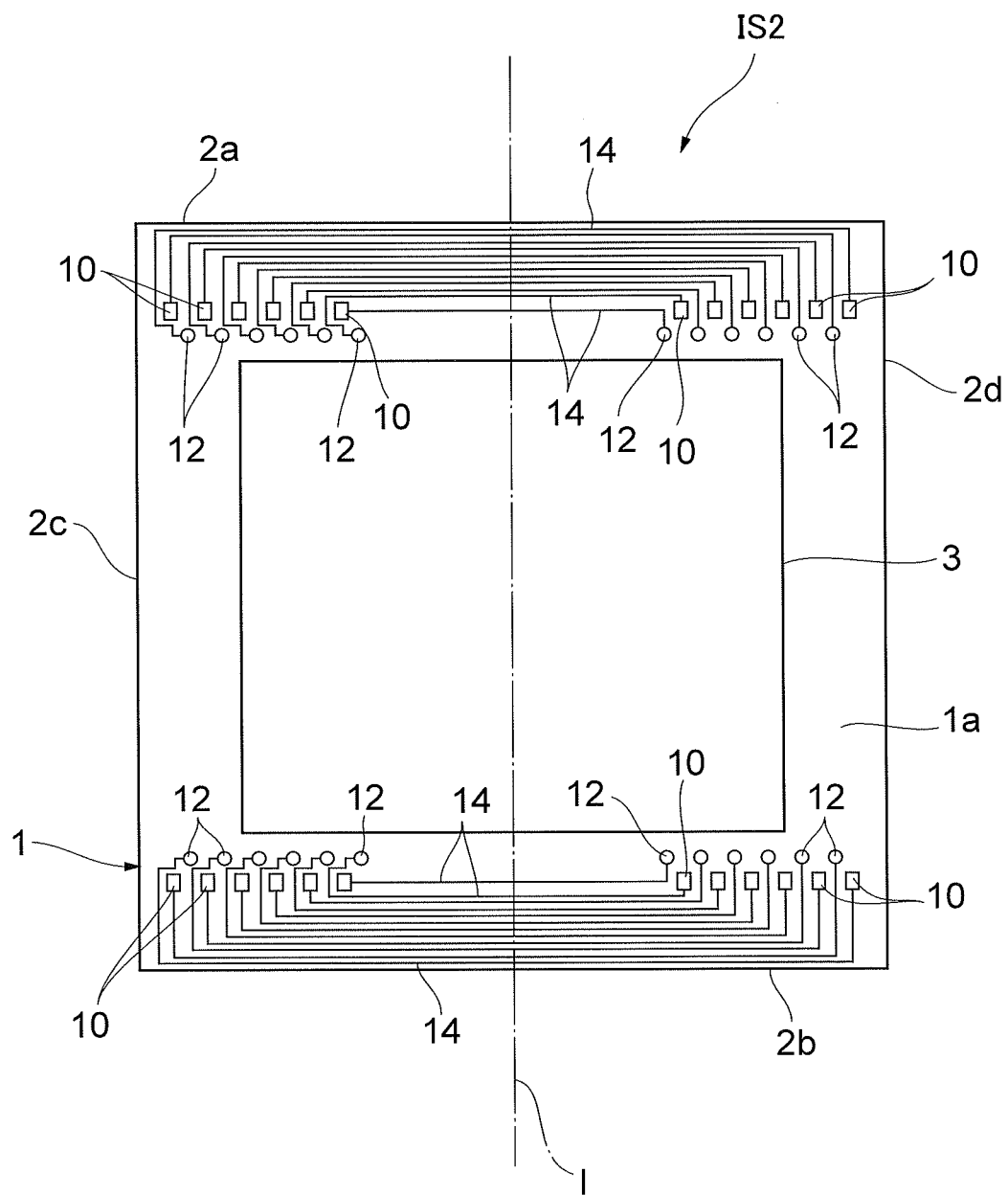
FIG. 3 is a plan view showing a back-illuminated solid-state image pickup element according to an embodiment of the present invention.
Figure 4:
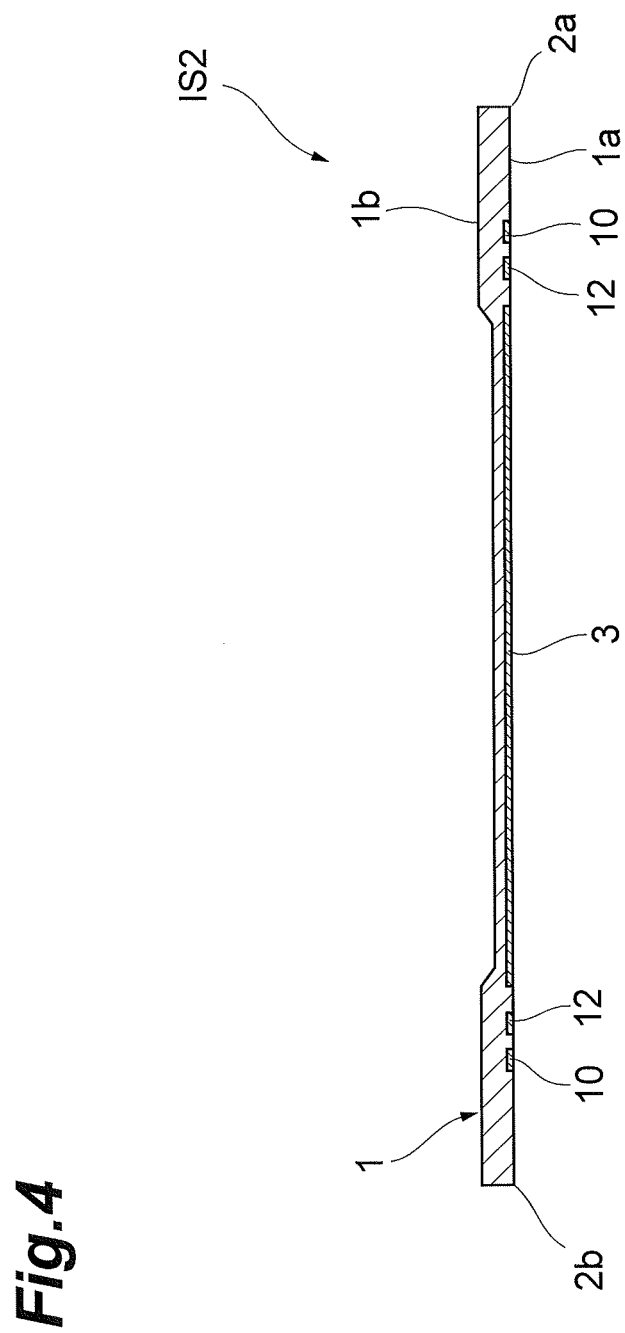
FIG. 4 is a drawing illustrating a cross-sectional configuration of the back-illuminated solid-state image pickup element according to the embodiment.

Next, a configuration of a back-illuminated solid-state image pickup element IS2 according to an embodiment of the present invention will be described with reference to FIGS. 3 and 4. FIG. 3 is a plan view showing the back-illuminated solid-state image pickup element according to the present embodiment. FIG. 4 is a drawing illustrating a cross-sectional view of the back-illuminated solid-state image pickup element according to the present embodiment. The illustration of the interconnections 14 is omitted from FIG. 4.

The back-illuminated solid-state image pickup element IS2, as shown in FIGS. 3 and 4, is provided with the semiconductor substrate 1, the plurality of first electrode pads 10, the plurality of second electrode pads 12, and the plurality of interconnections 14 as the solid-state image pickup element IS1 is. The solid-state image pickup element IS2 is a so-called BT (Back-Thinned)-CCD image sensor.

The semiconductor substrate 1 is thinned by etching a central region thereof with an aqueous KOH solution from the principal face 1b side. This thinning results in forming a recess portion on the principal face 1b side in the central region of the semiconductor substrate 1. A frame portion thicker than the recess portion is present around the recess portion of the semiconductor substrate 1. The frame portion may be removed by etching whereby the solid-state image pickup element IS2 is constructed as a BT-CCD image sensor wherein the entire region of the semiconductor substrate 1 is thinned.

In the solid-state image pickup element IS2, the principal face 1b side is the light receiving surface side. FIG. 3 is the plan view of the solid-state image pickup element IS2 as viewed from the back face (principal face 1a) side to the light receiving surface. FIG. 3, like FIG. 1, is drawn without the illustration of interconnections electrically connecting the photosensitive region 3 and each of the electrode pads 10, 12.

Figure 5:
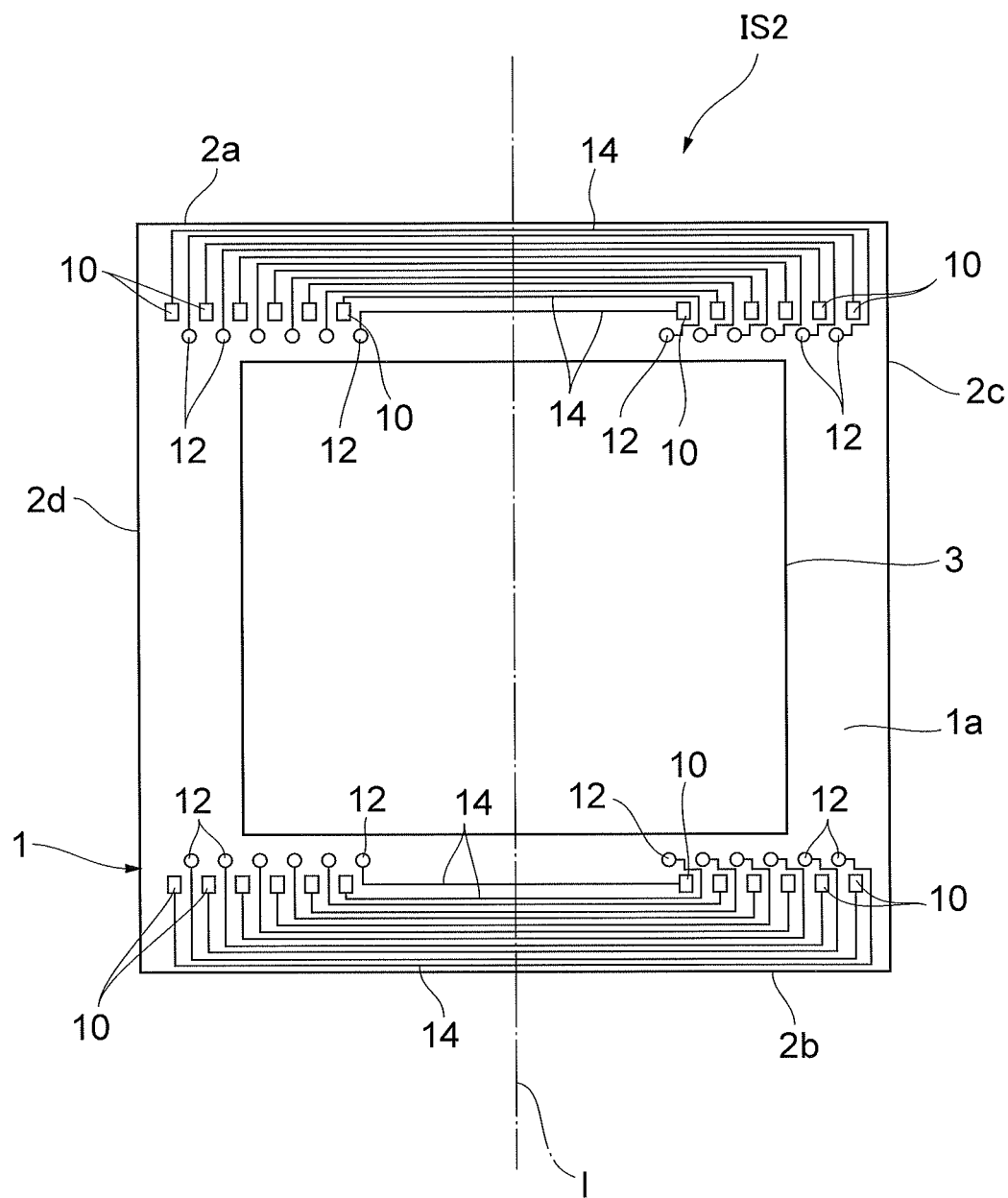
FIG. 5 is a perspective plan view for illustrating first and second electrode pads in the back-illuminated solid-state image pickup element according to the embodiment.

In the solid-state image pickup element IS2 as well, as shown in FIG. 3, each interconnection 14 connects the first electrode pad 10 and the second electrode pad 12 in a positional relation of line symmetry with respect to the center line 1 perpendicular to the array directions of the first and second electrode pads 10, 12. Therefore, when the solid-state image pickup element IS2 is seen through from the light receiving surface (principal face 1b) side, as shown in FIG. 5, the positions (array order) in the array direction of the respective first electrode pads 10 in the solid-state image pickup element IS2 are the same as the positions (array order) in the array direction of the second electrode pads 12 connected through the interconnections 14 to the corresponding first electrode pads 10 in the solid-state image pickup element IS1. Similarly, when the solid-state image pickup element IS2 is seen through from the light receiving surface (principal face 1b) side, the positions (array order) in the array direction of the respective second electrode pads 12 in the solid-state image pickup element IS2 are the same as the positions (array order) in the array direction of the first electrode pads 10 connected through the interconnections 14 to the corresponding second electrode pads 12 in the solid-state image pickup element IS1.

Figure 6:
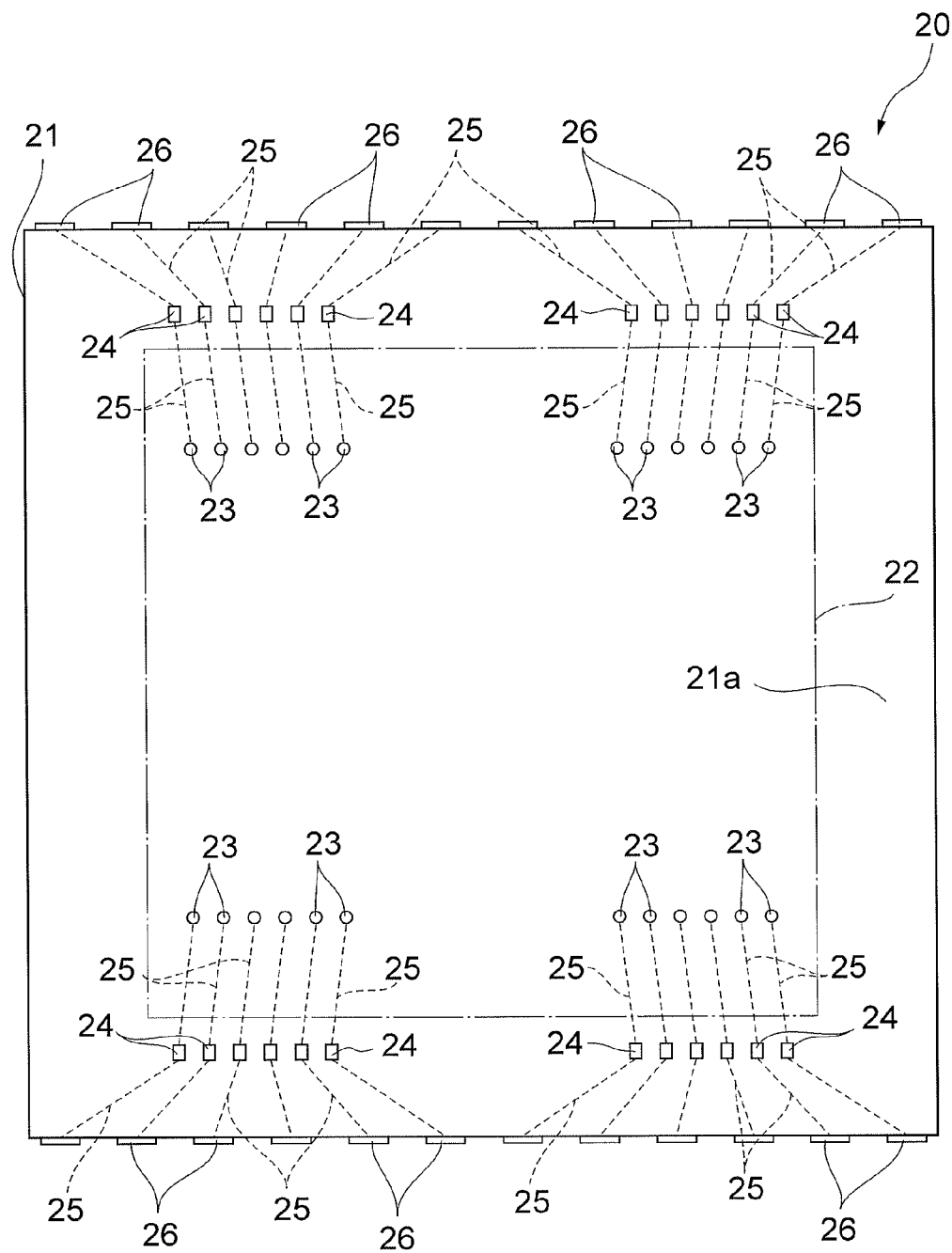
FIG. 6 is a plan view showing a mounting member according to an embodiment of the present invention.
Figure 7:
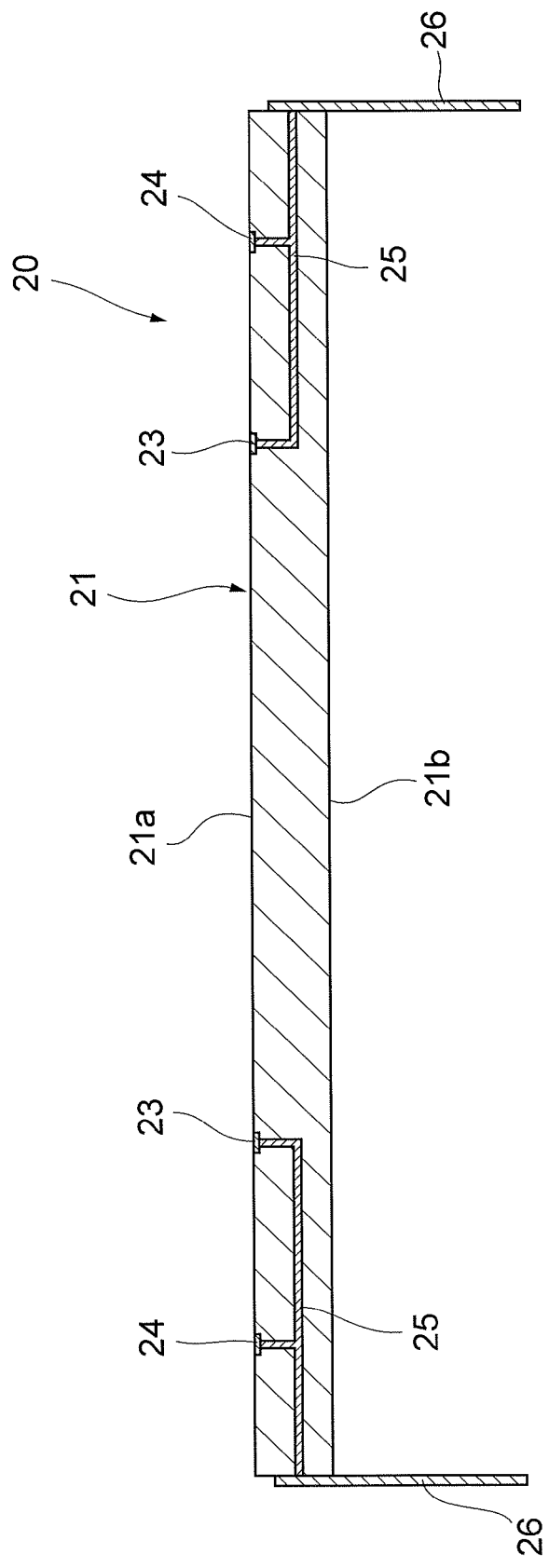
FIG. 7 is a drawing illustrating a cross-sectional configuration of the mounting member according to the embodiment.

Next, a configuration of a mounting member 20 on which the solid-state image pickup element IS1 or IS2 is to be mounted will be described with reference to FIGS. 6 and 7. FIG. 6 is a plan view showing the mounting member according to the present embodiment. FIG. 7 is a drawing illustrating a cross-sectional configuration of the mounting member according to the present embodiment.

The mounting member 20 is a so-called package and is provided with a substrate 21 of a rectangular shape on the plan view. The substrate 21 includes principal faces 21a, 21b opposed to each other. In the substrate 21, there are a plurality of electrode pads 23, 24 arranged at predetermined positions on the principal face 21a thereof. Internal interconnections 25 are arranged inside the substrate 21 and external terminal 26 are arranged on side faces of the substrate 21.

Each electrode pad 23 is arranged inside an intended mounting region 22 on the principal face 21a of the substrate 21. The intended mounting region 22 herein is a region on which the solid-state image pickup element IS1 or IS2 is intended to be mounted, and has a rectangular shape located approximately in the center of the substrate 21 of the rectangular shape on the plan view. The electrode pads 23 are arrayed in a line as aligned along the peripheral edge portion of the intended mounting region 22. The electrode pads 23 are to be connected to the second electrode pads 12 of the back-illuminated solid-state image pickup element IS2. The positions of the electrode pads 23 correspond to the array positions of the second electrode pads 12 of the solid-state image pickup element IS2 to be mounted. The electrode pads 23 have a circular shape.

Each electrode pad 24 is arranged outside the intended mounting region 22 on the principal face 21a of the substrate 21. Namely, the electrode pads 24 each are arrayed in a line outside the intended mounting region 22. The electrode pads 24 are provided as many as the electrode pads 23. The electrode pads 24 are to be connected to the first electrode pads 10 of the front-illuminated solid-state image pickup element IS1. The positions of the electrode pads 24 correspond to the array positions of the first electrode pads 10 of the solid-state image pickup element IS1 to be mounted. The electrode pads 23, 24 are formed by a method such as printing or sputtering, using an electroconductive material such as metal. The electrode pads 24 have a rectangular shape.

The corresponding electrode pad 23 and electrode pad 24 are electrically connected to each other by an internal interconnection 25. The internal interconnections 25 are electrically connected respectively to the plurality of external terminals 26 arranged so as to extend downward from the side faces of the substrate 21. As a consequence, a common input/output signal is transmitted through the internal interconnection 25 and the external terminal 26 to the corresponding electrode pads 23 and 24.

Figure 8:
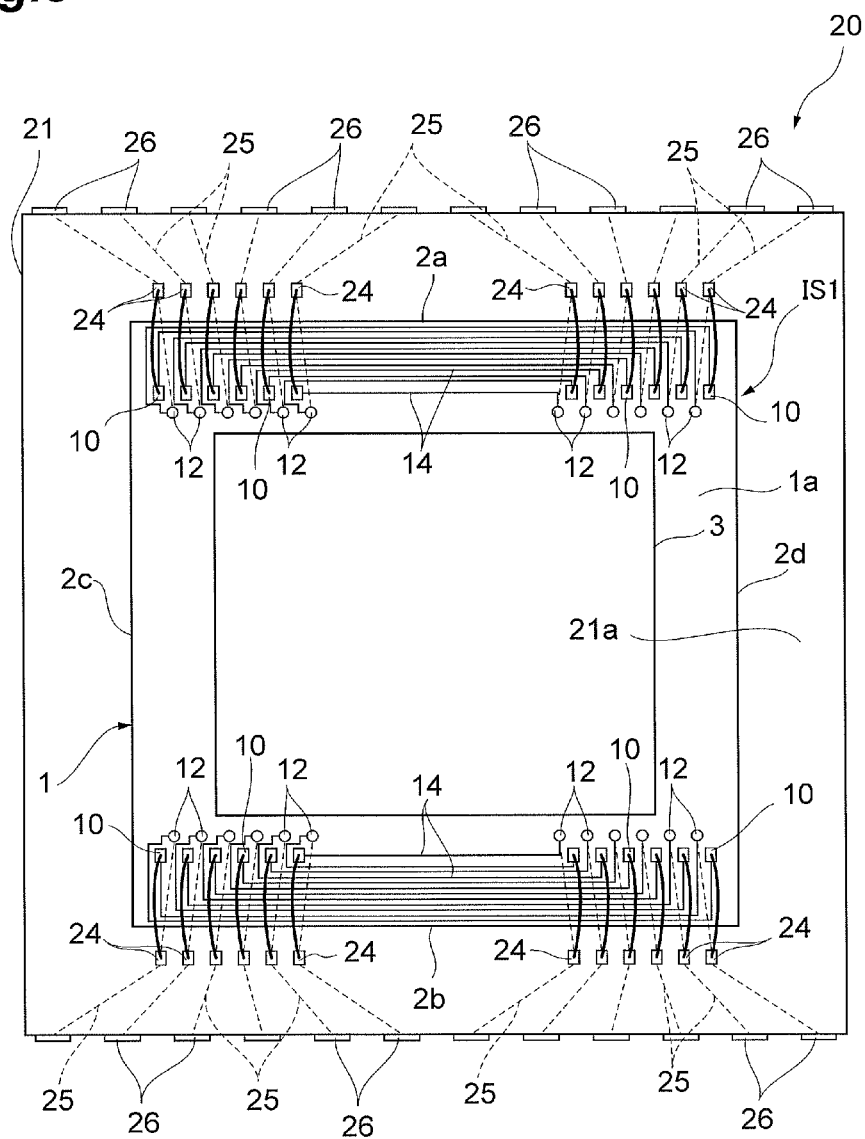
FIG. 8 is a plan view showing a solid-state image pickup element mounting structure according to an embodiment of the present invention.
Figure 9:
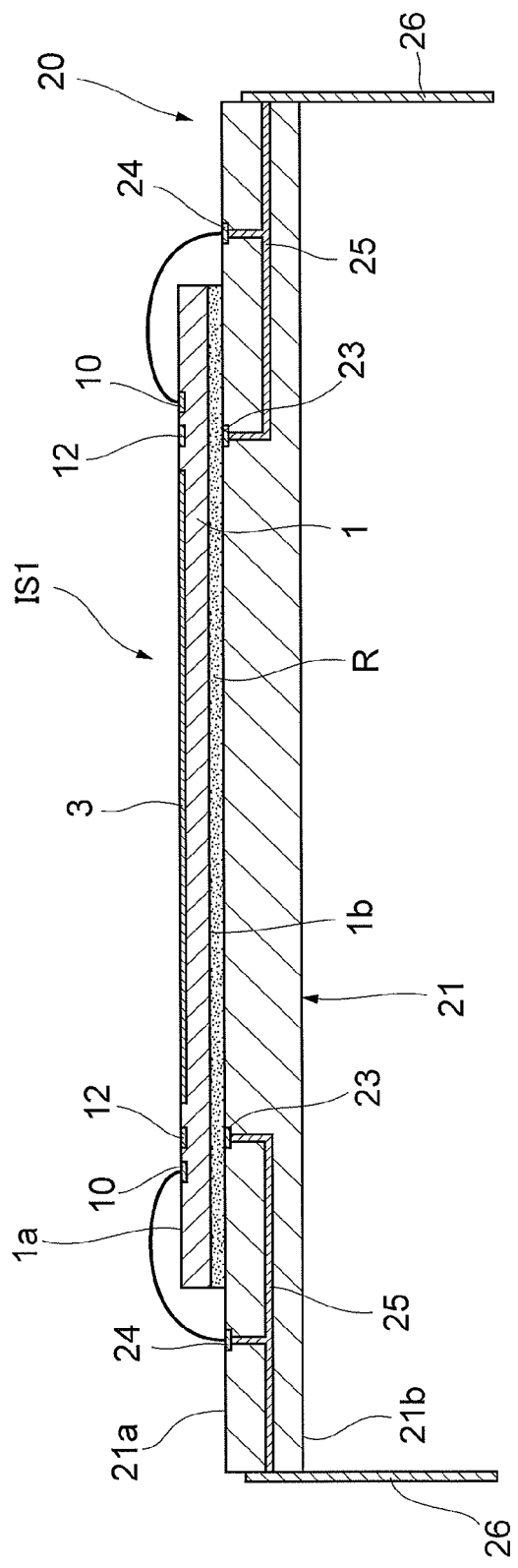
FIG. 9 is a drawing illustrating a cross-sectional configuration in the solid-state image pickup element mounting structure according to the embodiment.
Figure 10:
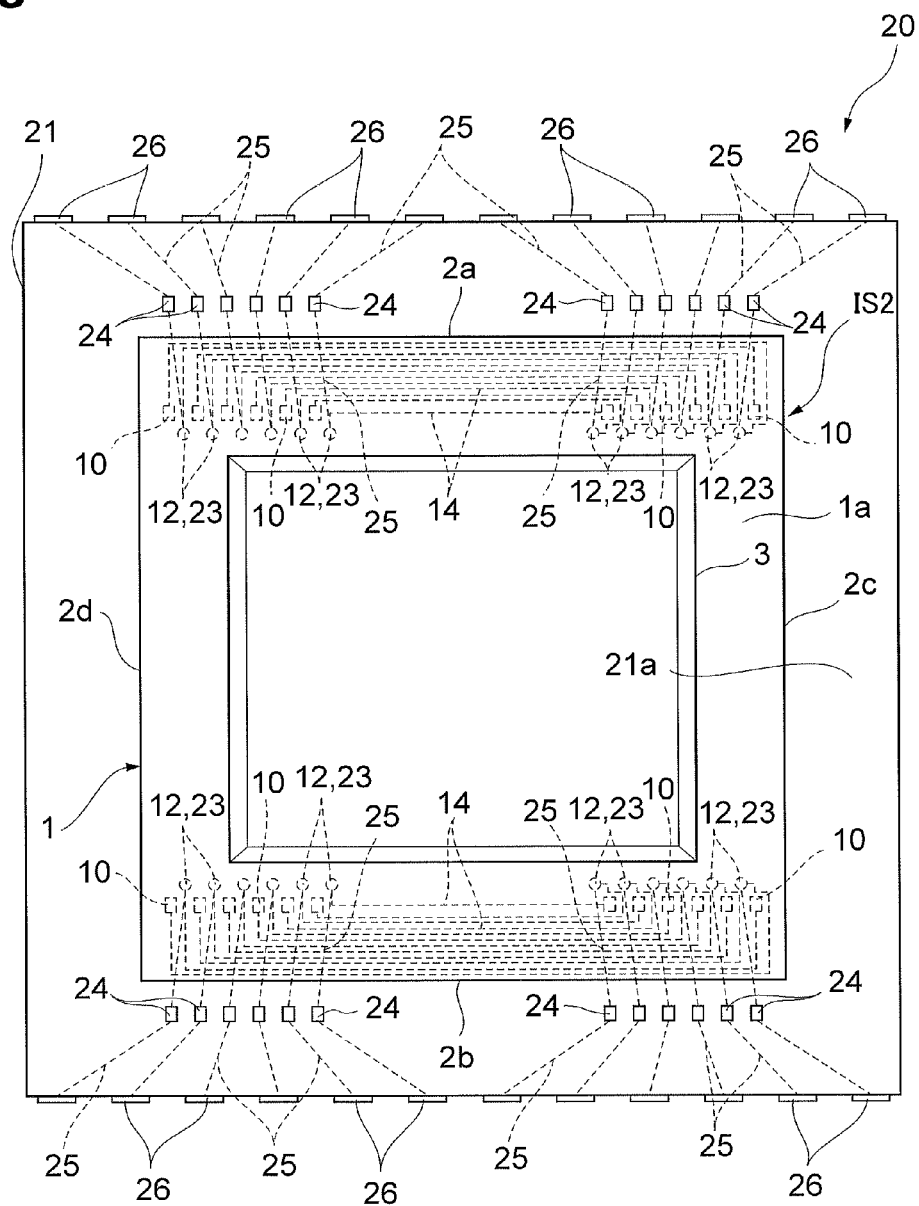
FIG. 10 is a plan view showing a solid-state image pickup element mounting structure according to an embodiment of the present invention.
Figure 11:
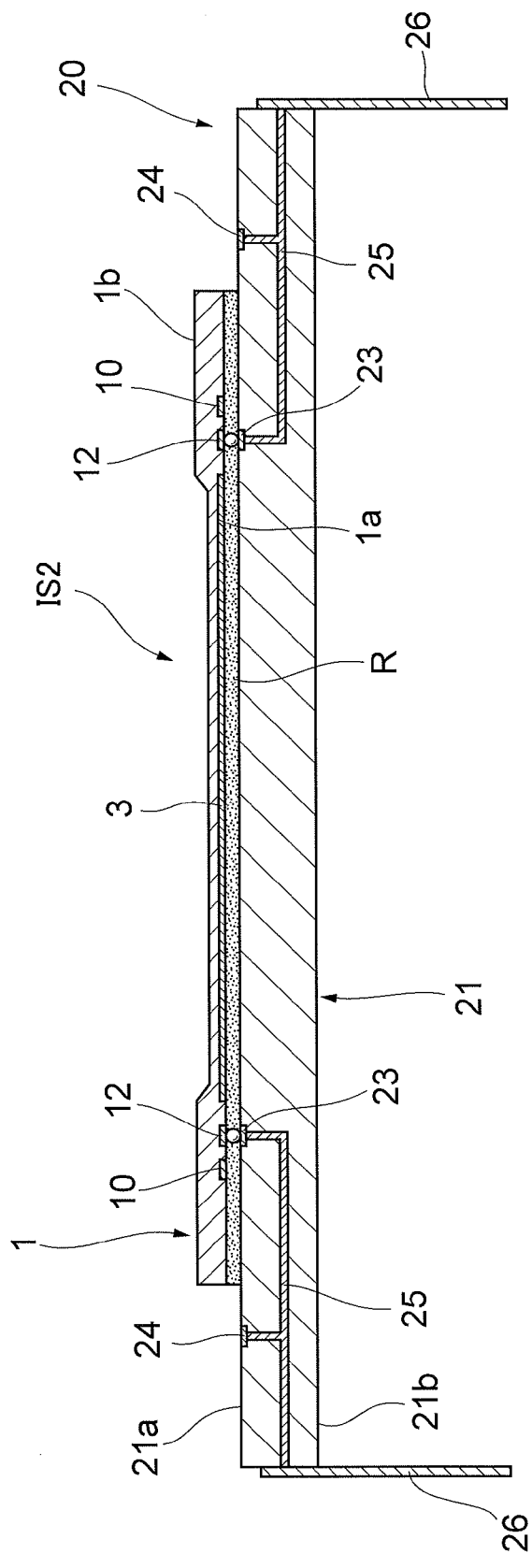
FIG. 11 is a drawing illustrating a cross-sectional configuration in the solid-state image pickup element mounting structure according to the embodiment.

Next, mounting structures of the solid-state image pickup elements IS1 and IS2 using the mounting member 20 will be described with reference to FIGS. 8 to 11. FIGS. 8 and 10 are plan views showing the solid-state image pickup element mounting structures according to an embodiment of the present invention. FIGS. 9 and 11 are drawings illustrating cross-sectional configurations in the solid-state image pickup element mounting structures according to the present embodiment.

As shown in FIGS. 8 and 9, the solid-state image pickup element IS1 is mounted on the mounting member 20 (the intended mounting region 22 of the substrate 21) so that the principal face 1b (the back face to the principal face 1a) is opposite to the principal face 21a of the mounting member 20 (substrate 21). The semiconductor substrate 1 of the solid-state image pickup element IS1 and the substrate 21 of the mounting member 20 are bonded to each other with a resin (e.g., epoxy resin, urethane resin, silicone resin, or acrylic resin, or a complex of these) R. The first electrode pads 10 and the electrode pads 24 are connected by wire bonding.

As shown in FIGS. 10 and 11, the solid-state image pickup element IS2 is mounted on the mounting member 20 (the intended mounting region 22 of the substrate 21) so that the principal face 1a is opposite to the principal face 21a of the mounting member 20 (substrate 21). The semiconductor substrate 1 of the solid-state image pickup element IS2 and the substrate 21 of the mounting member 20 are bonded to each other with the resin R. The second electrode pads 12 and the electrode pads 23 are connected by flip chip bonding.

Figure 12:
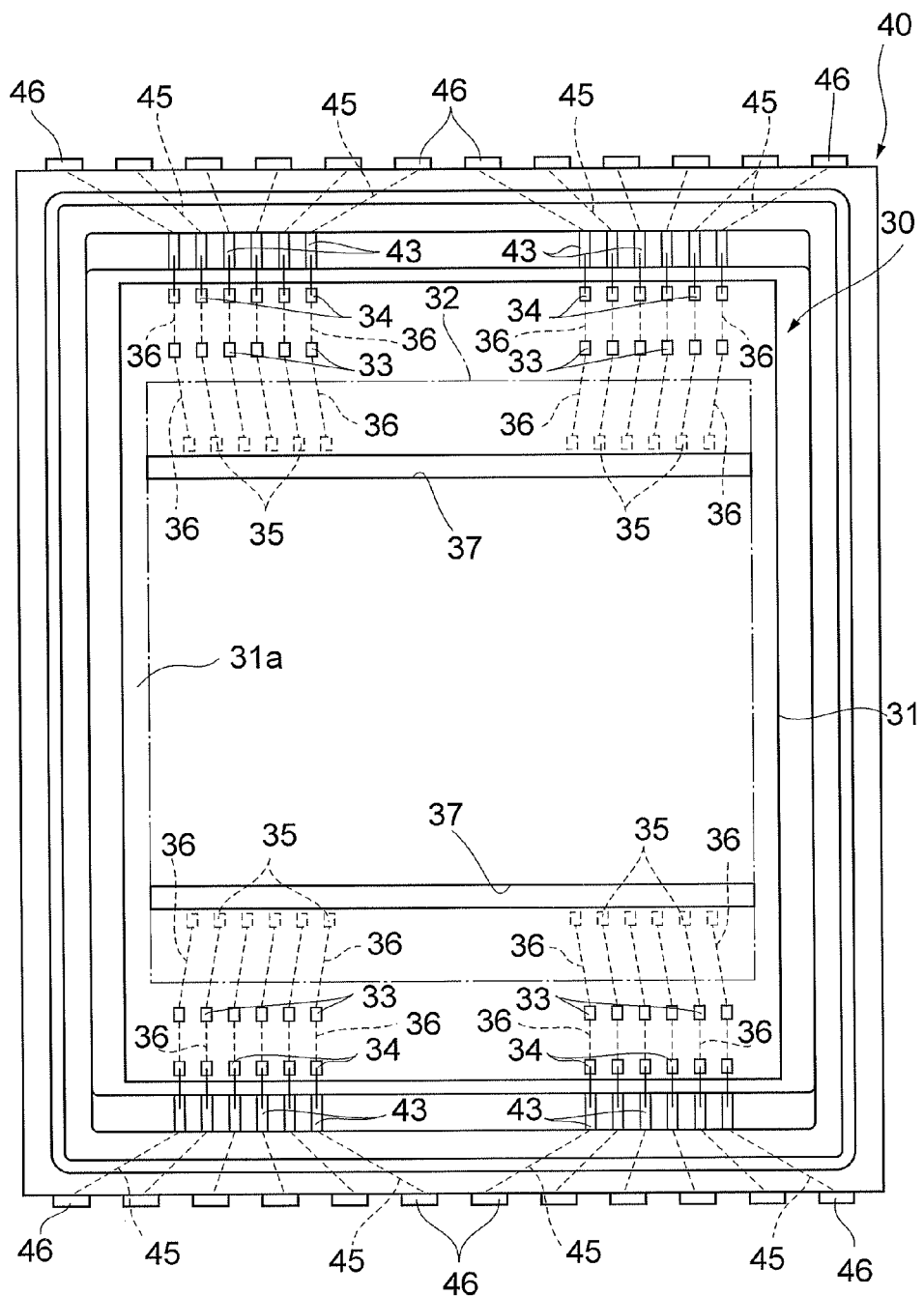
FIG. 12 is a plan view showing a mounting member according to an embodiment of the present invention.
Figure 13:
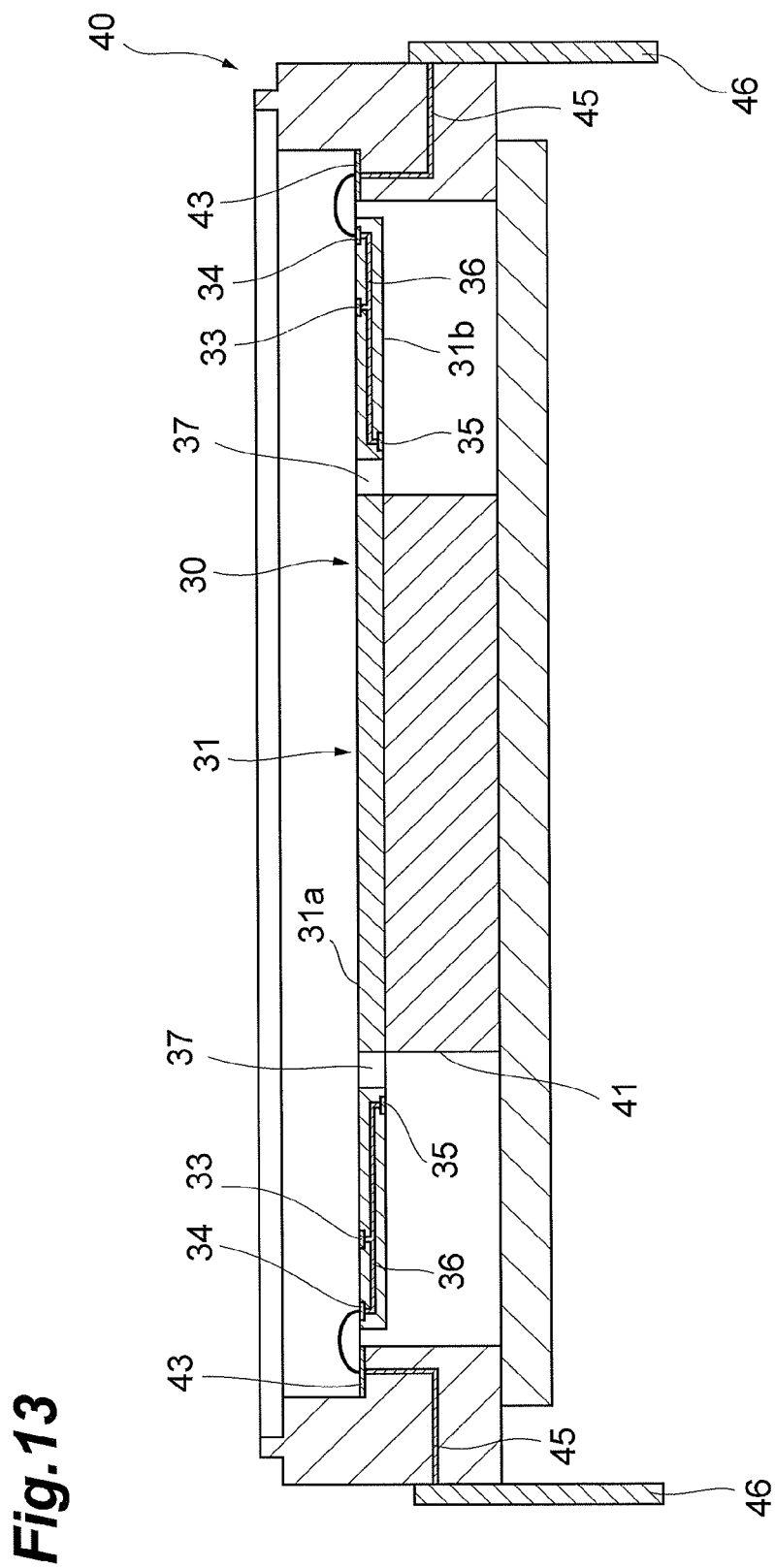
FIG. 13 is a drawing illustrating a cross-sectional configuration of the mounting member according to the embodiment.

Next, a configuration of a mounting member 30 on which the solid-state image pickup element IS1 or IS2 is to be mounted, will be described with reference to FIGS. 12 and 13. FIG. 12 is a plan view showing the mounting member according to an embodiment of the present invention. FIG. 13 is a drawing illustrating a cross-sectional configuration of the mounting member according to the present embodiment.

The mounting member 30 is a so-called interposer and is provided with a substrate 31 of a rectangular shape on the plan view. The substrate 31 includes principal faces 31a, 31b opposed to each other. In the substrate 31 there are a plurality of electrode pads 33, 34 arranged at predetermined positions on the principal face 31a and a plurality of electrode pads 35 arranged at predetermined positions on the principal face 31b. Internal interconnections 36 are arranged inside the substrate 31.

The mounting member 30 is arranged in a housing space of a package 40 and is mounted through a pedestal 41 on a bottom portion of the package 40. On a frame portion of the package 40, a plurality of electrode pads 43 are arranged at predetermined positions thereof. Internal interconnections 45 are arranged in the frame portion of the package 40 and external terminals 46 are arranged on side faces of the package 40. The corresponding electrode pad 43 and external terminal are electrically connected to each other by an internal interconnection 45. The electrode pads 43 are formed by a method such as printing or sputtering, using an electroconductive material such as metal. The package 40 is provided with a window part (not shown) arranged opposite to the mounting member 30. A Peltier element may be used instead of the pedestal 41.

Each electrode pad 33 is arranged outside an intended mounting region 32 on the principal face 31a of the substrate 31. The intended mounting region 32 herein is a region on which the solid-state image pickup element IS1 or IS2 is to be mounted, and has a rectangular shape located approximately in the center of the substrate 31 of the rectangular shape on the plan view. The electrode pads 33 each are arrayed in a line outside the intended mounting region 32. The electrode pads 33 are to be connected to the first electrode pads 10 of the front-illuminated solid-state image pickup element IS1. The positions of the electrode pads 33 correspond to the array positions of the first electrode pads 10 of the solid-state image pickup element IS1 to be mounted.

Each electrode pad 34 is arranged at the edge portion of the mounting member 30 on the principal face 31a of the substrate 31. The electrode pads 34 are arrayed in a line along the edge portion of the mounting member 30. The electrode pads 34 are connected to the electrode pads 43 of the package 40 by wire bonding. The positions of the electrode pads 34 correspond to the array positions of the electrode pads 43 of the package 40. The electrode pads 34 are provided as many as the electrode pads 43.

Each electrode pad 35 is arranged inside a region corresponding to the intended mounting region 32 on the principal face 31b of the substrate 31. The electrode pads 35 each are arrayed in a line inside the region corresponding to the intended mounting region 32. The electrode pads 35 are provided as many as the electrode pads 33 and as many as the electrode pads 34 as well. The electrode pads 35 are to be connected to the second electrode pads 12 of the back-illuminated solid-state image pickup element IS2. The positions of the electrode pads 35 correspond to the array positions of the second electrode pads 12 of the solid-state image pickup element IS2 to be mounted. The electrode pads 33, 34, and 35 are formed by a method such as printing or sputtering, using an electroconductive material such as metal.

In the mounting member 30 there are through holes 37 formed for connecting the second electrode pads 12 of the solid-state image pickup element IS2 to the electrode pads 35 by wire bonding. The through holes 37 are formed along the array of electrode pads 35. The through holes 37 are formed at positions where the second electrode pads 12 of the solid-state image pickup element IS2 to be mounted on the mounting member 30 face the through holes 37.

The corresponding electrode pad 33, electrode pad 34, and electrode pad 35 are electrically connected to each other by an internal interconnection 36. As a consequence, a common input/output signal is transmitted through the internal interconnection 36, electrode pad 35, bonding wire, electrode pad 43, internal interconnection 45, and external terminal 26 to the corresponding electrode pad 33 and electrode pad 35.

Figure 14:
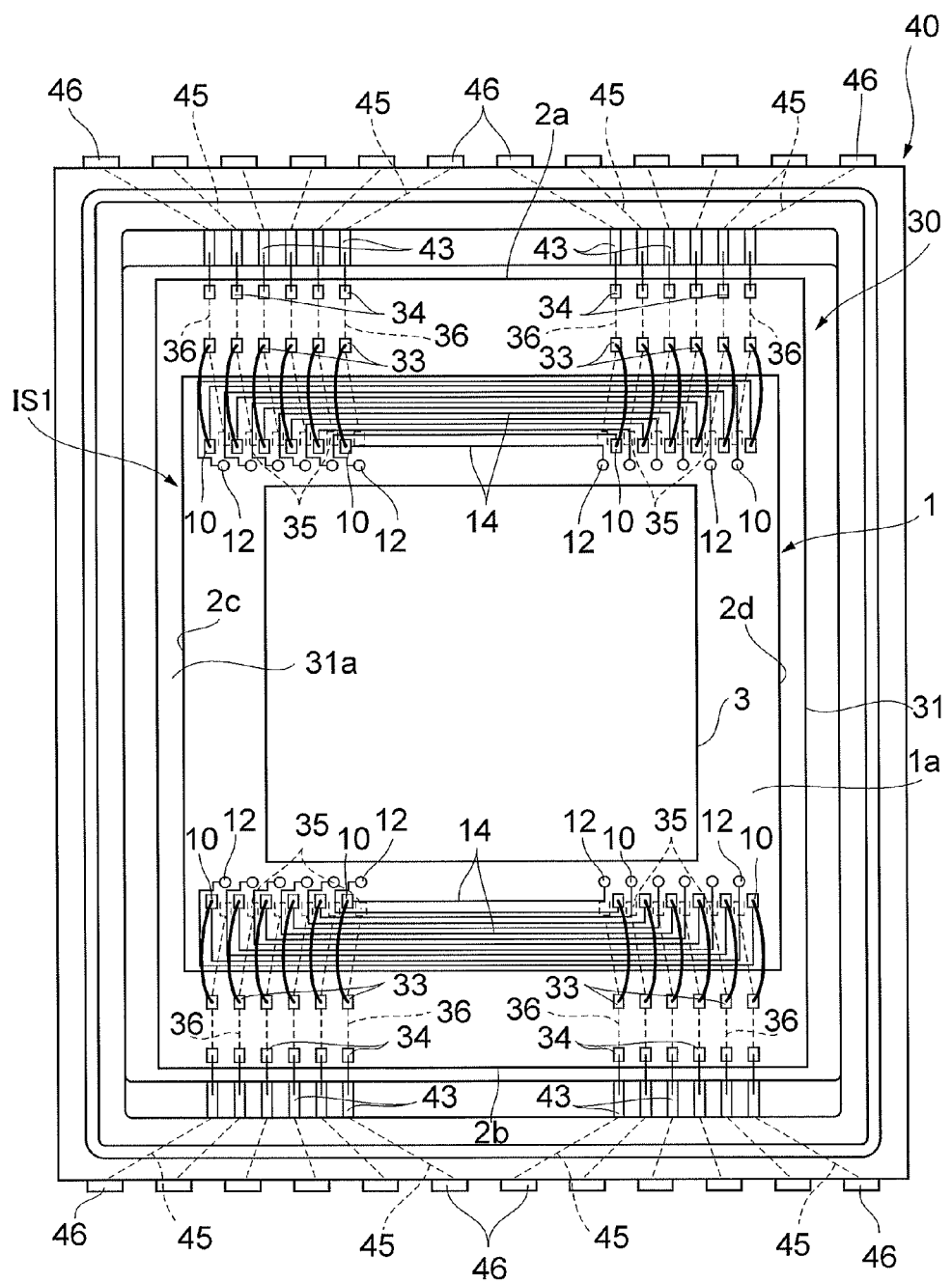
FIG. 14 is a plan view showing a solid-state image pickup element mounting structure according to an embodiment of the present invention.
Figure 15:
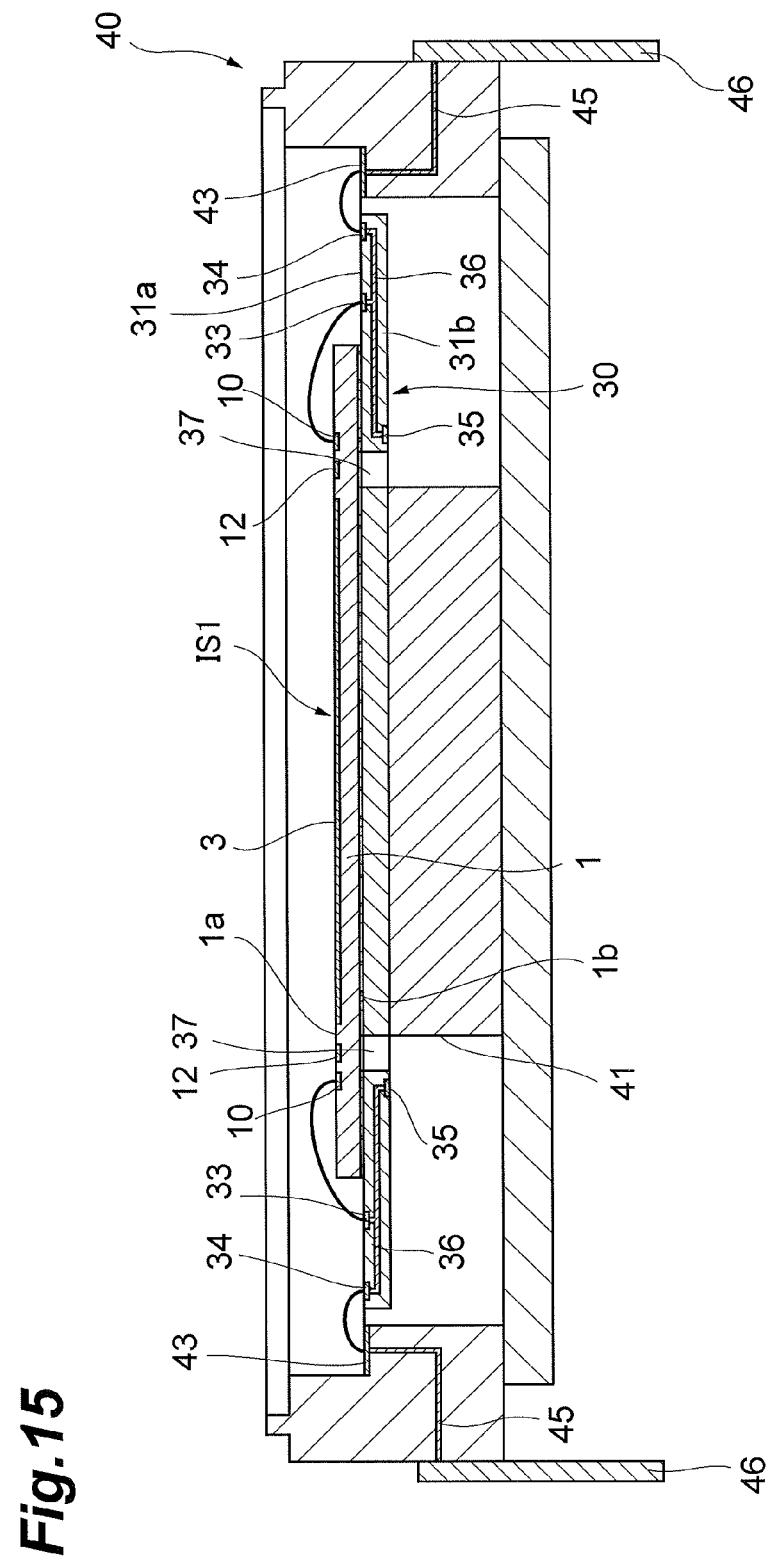
FIG. 15 is a drawing illustrating a cross-sectional configuration in the solid-state image pickup element mounting structure according to the embodiment.
Figure 16:
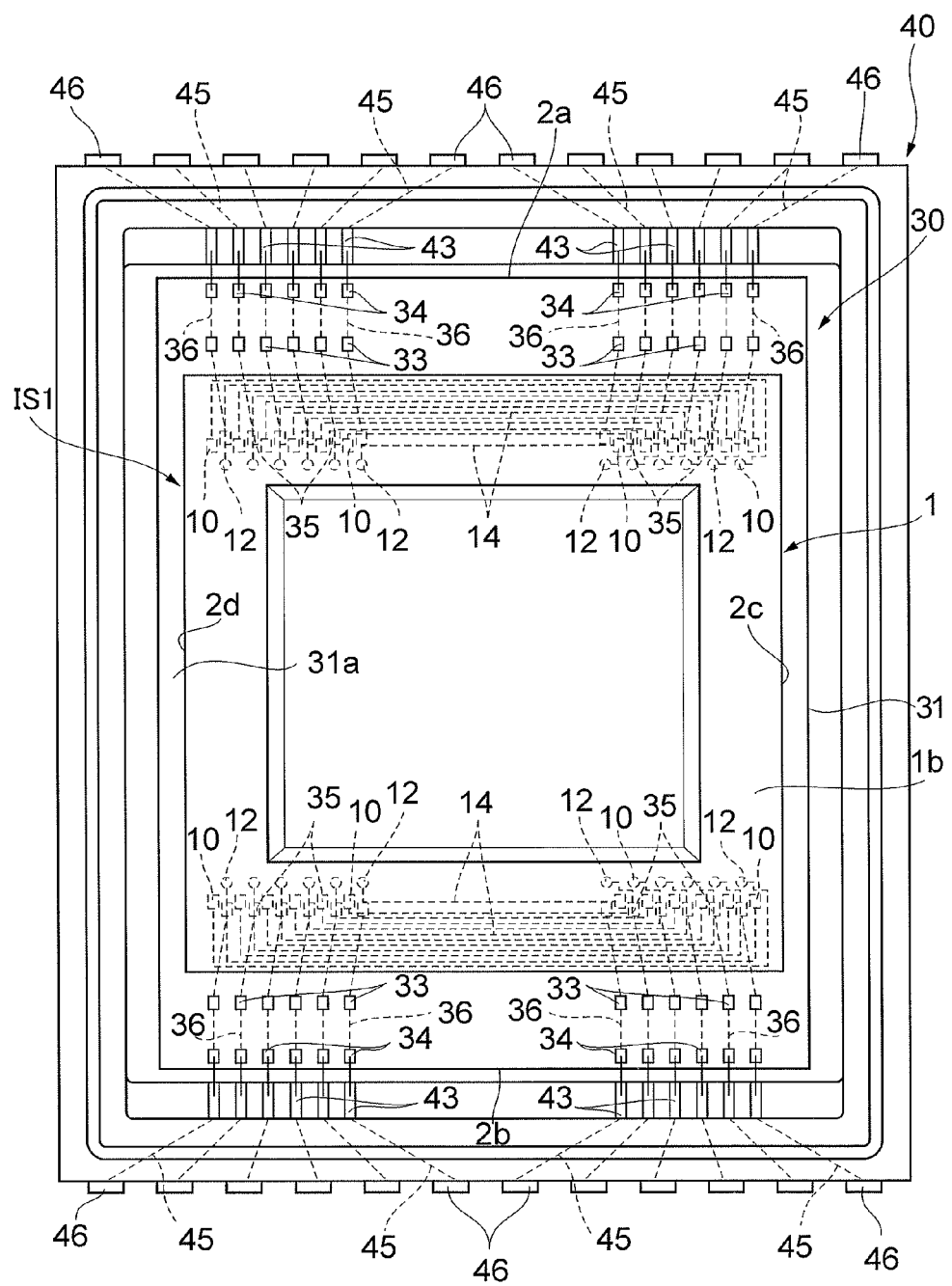
FIG. 16 is a plan view showing a solid-state image pickup element mounting structure according to the embodiment.
Figure 17:
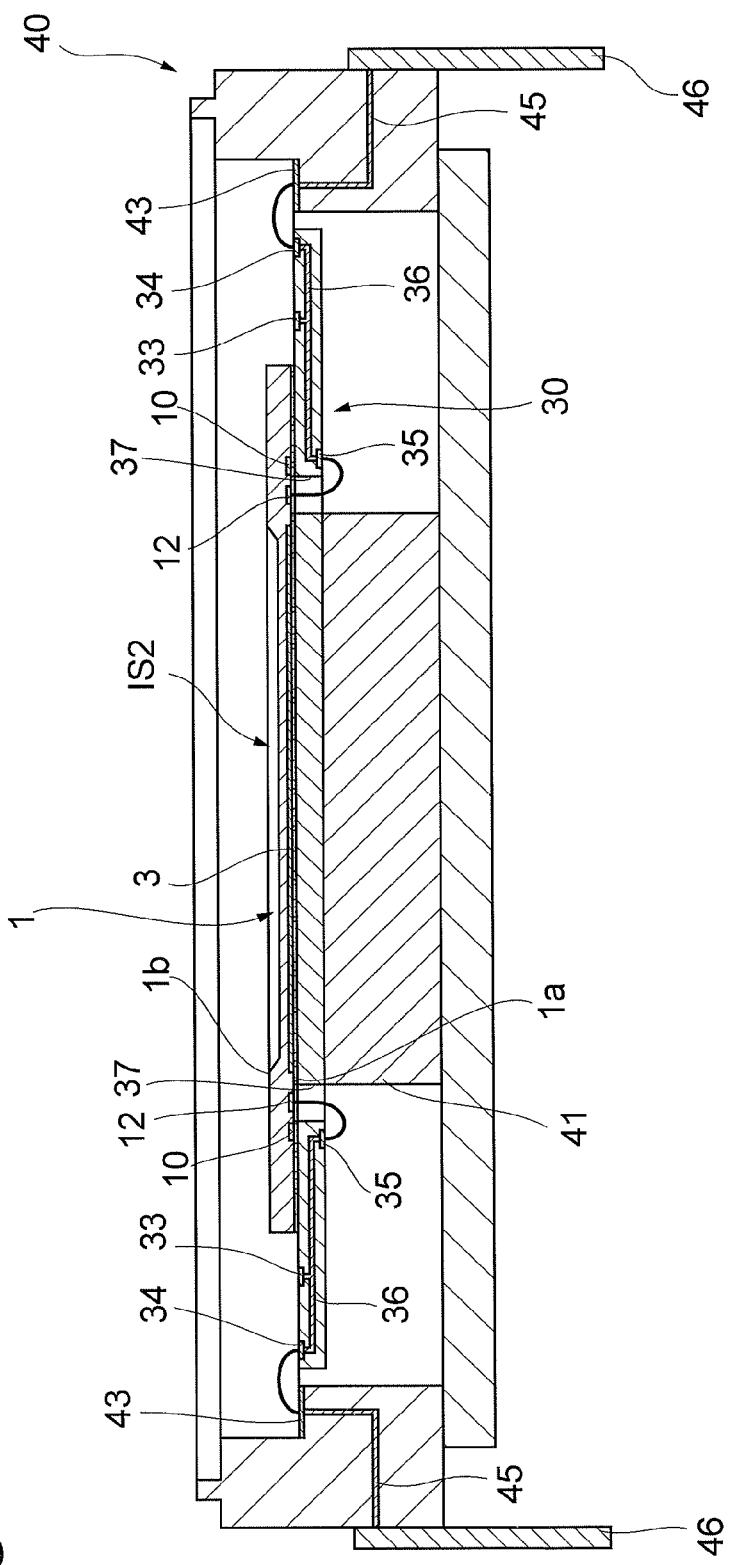
FIG. 17 is a drawing illustrating a cross-sectional configuration in the solid-state image pickup element mounting structure according to the embodiment.

Next, mounting structures of the solid-state image pickup elements IS1 and IS2 using the mounting member 30 will be described with reference to FIGS. 14 to 17. FIGS. 14 and 16 are plan views showing the solid-state image pickup element mounting structures according to an embodiment of the present invention. FIGS. 15 and 17 are drawings illustrating cross-sectional configurations in the solid-state image pickup element mount structures according to the present embodiment.

As shown in FIGS. 14 and 15, the solid-state image pickup element IS1 is mounted on the mounting member 30 (the intended mounting region 32 of the substrate 31) so that the principal face 1b (the back face to the principal face 1a) is opposite to the principal face 31a of the mounting member 30 (substrate 31). The semiconductor substrate 1 of the solid-state image pickup element IS1 and the substrate 31 of the mounting member 30 are bonded to each other with a resin. The first electrode pads 10 and the electrode pads 33 are connected by wire bonding.

As shown in FIGS. 16 and 17, the solid-state image pickup element IS2 is mounted on the mounting member 30 (the intended mounting region 32 of the substrate 31) so that the principal face 1a is opposite to the principal face 31a of the mounting member 30 (substrate 31). The semiconductor substrate 1 of the solid-state image pickup element IS2 and the substrate 31 of the mounting member 30 are bonded to each other with the resin. The second electrode pads 12 and the electrode pads 35 are connected through the through holes 37 by wire bonding.

In the embodiments of the present invention, as described above, the first electrode pad 10 and the second electrode pad 12 in the positional relation of line symmetry with respect to the center line 1 perpendicular to the array directions of the plurality of first and second electrode pads 10, 12 are connected through the interconnection 14. Namely, the first electrode pad 10 and the second electrode pad 12 in the same order relation in the array order in the first direction along the sides 2a, 2b among the plurality of first electrode pads 10 and in the array order in the second direction along the sides 2a, 2b among the plurality of second electrode pads 12 are connected through the interconnection 14. Therefore, even with reversal of the principal face 1a and the principal face 1b, the positions of the first electrode pads 10 and the second electrode pads 12 connected to each other through the interconnections 14 are the same in the array directions of the respective electrode pads 10, 12.

In comparison between the case where the principal face 1b of the solid-state image pickup element IS1 is mounted opposite to the mounting member 20, 30 and the case where the principal face 1a of the solid-state image pickup element IS2 is mounted opposite to the mounting member 20, 30, there is no reversal of the positional relation of the external terminals 26 of the mounting member 20 electrically connected to the first electrode pads 10 or to the second electrode pads 12 and the positional relation between the electrode pads 34 of the mounting member 30 and the external terminals 46 of the package 40. As a consequence of this, there is no need for preparing two types of external circuits such as the drive circuits and no need for preparing two types of mounting members 20, 30, either. Therefore, the embodiments of the present invention allow easy reduction of the cost and preparatory period of the external circuit or the mounting member or the like.

In the embodiments of the present invention, the plurality of first electrode pads 10 are located nearer to the edge of the semiconductor substrate 1 than the plurality of second electrode pads 12 are. Namely, the plurality of first electrode pads 10 are located nearer to the sides 2a, 2b of the semiconductor substrate 1 than the plurality of second electrode pads 12 are. This facilitates the connection by wire bonding to each first electrode pad 10, in mounting the solid-state image pickup element IS1 with the principal face 1b being opposite to the mounting member 20, 30.

The above described the preferred embodiments of the present invention but it should be noted that the present invention is by no means limited to the foregoing embodiments and can be modified in many ways without departing from the spirit and scope of the invention.

The first and second electrode pads 10, 12 are arranged in the respective regions near to the two opposed sides 2a, 2b with the photosensitive region 3 in between them, but there is no need for being limited to this. For example, the first and second electrode pads 10, 12 may be formed in a region near to one side 2a or 2b out of the two sides 2a and 2b.

The numbers and the array numbers of first and second electrode pads 10, 12 are not limited to those disclosed in the above embodiments, either. The first and second electrode pads 10, 12 do not have to be arranged in the zigzag patterns but may be arranged in a line or in parallel lines.

INDUSTRIAL APPLICABILITY

The present invention is applicable to the front-illuminated or back-illuminated solid-state image pickup elements and the mounting structures thereof.

REFERENCE SIGNS LIST 1 semiconductor substrate; 1a, 1b principal faces; 2a-2d sides; 3 photosensitive region; 10 first electrode pads; 12 second electrode pads; 14 interconnections; 20 mounting member; 21a, 21b principal faces; 23, 24 electrode pads; 30 mounting member; 31a, 31b principal faces; 33, 35 electrode pads; 46 external terminals; IS1, IS2 solid-state image pickup elements; 1 center line.

The invention claimed is:

1. A solid-state image pickup element mounting structure comprising:
a solid-state image pickup element comprising:
a semiconductor substrate having a photosensitive region, a CCD being formed as pixels in the photosensitive region;
a plurality of first electrode pads arranged in a first array in a first direction on a principal face of the semiconductor substrate;
a plurality of second electrode pads arranged in a second array in the first direction on the principal face of the semiconductor substrate;
a plurality of interconnections connecting the plurality of first electrode pads and the plurality of second electrode pads in one-to-one correspondence, and
wherein the plurality of interconnections connect the first and second electrode pads so that each interconnection connects the first electrode pad and the second electrode pad in a positional relation of line symmetry with respect to a center line of the first and second arrays, wherein the center line is perpendicular to the first direction, and
the first array and the second array are separately arranged;
wherein the semiconductor substrate has a light receiving surface side defined on the principal face side,
a mounting member on which the solid-state image pickup element is mounted and in which a plurality of third electrode pads are arranged on a principal face thereof,
wherein the solid-state image pickup element is mounted on the mounting member so that the back face to the principal face of the solid-state image pickup element is opposite to the principal face of the mounting member, and
wherein the plurality of first electrode pads and the plurality of third electrode pads are connected by wire bonding.

2. The solid-state image pickup element mounting structure according to claim 1,
wherein the plurality of first electrode pads are located nearer to an edge of the semiconductor substrate than the plurality of second electrode pads.

3. A solid-state image pickup element mounting structure comprising:
a solid-state image pickup element comprising:
a semiconductor substrate having a photosensitive region, a CCD being formed as pixels in the photosensitive region;
a plurality of first electrode pads arranged in a first array in a first direction on a principal face of the semiconductor substrate;
a plurality of second electrode pads arranged in a second array in the first direction on the principal face of the semiconductor substrate;
a plurality of interconnections connecting the plurality of first electrode pads and the plurality of second electrode pads in one-to-one correspondence, and
wherein the plurality of interconnections connect the first and second electrode pads so that each interconnection connects the first electrode pad and the second electrode pad in a positional relation of line symmetry with respect to a center line of the first and second arrays, wherein the center line is perpendicular to the first direction, and
the first array and the second array are separately arranged;
wherein the semiconductor substrate has a light receiving surface side defined on the back face side to the principal face, a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to the principal face of the mounting member, and wherein the plurality of second electrode pads and the plurality of third electrode pads are connected by flip chip bonding.

4. The solid-state image pickup element mounting structure according to claim 3, wherein the plurality of first electrode pads are located nearer to an edge of the semiconductor substrate than the plurality of second electrode pads.

5. A solid-state image pickup element mounting structure comprising:

a solid-state image pickup element comprising:
a semiconductor substrate having a photosensitive region, a CCD being formed as pixels in the photosensitive region;
a plurality of first electrode pads arranged in a first array in a first direction on a principal face of the semiconductor substrate;
a plurality of second electrode pads arranged in a second array in the first direction on the principal face of the semiconductor substrate;
a plurality of interconnections connecting the plurality of first electrode pads and the plurality of second electrode pads in one-to-one correspondence, and
wherein the plurality of interconnections connect the first and second electrode pads so that each interconnection connects the first electrode pad and the second electrode pad in a positional relation of line symmetry with respect to a center line of the first and second arrays, wherein the center line is perpendicular to the first direction, and
the first array and the second array are separately arranged
wherein the semiconductor substrate has a light receiving surface side defined on the back face side to the principal face, a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to a back face to the principal face of the mounting member, and wherein the plurality of second electrode pads and the plurality of third electrode pads are connected by wire bonding.

6. The solid-state image pickup element mounting structure according to claim 5, wherein the plurality of first electrode pads are located nearer to an edge of the semiconductor substrate than the plurality of second electrode pads.

7. A solid-state image pickup element mounting structure comprising:

a solid-state image pickup element comprising:
a semiconductor substrate of a rectangular shape having a photosensitive region, a CCD being formed as pixels in the photosensitive region;
a plurality of first electrode pads linearly disposed in a first array on a principal face of the semiconductor substrate and symmetrically distributed about a center line of the first array;
a plurality of second electrode pads linearly disposed in a second array parallel to the first array on the principal face of the semiconductor substrate and symmetrically distributed about the center line;
a plurality of interconnections connecting the plurality of first electrode pads and the plurality of second electrode pads in one-to-one correspondence, and
wherein the plurality of interconnections connect the first and second electrode pads so that each interconnection connects the first electrode pad and the second electrode pad in an identical order relation in an array order in a first direction and in an array order in a second direction opposite to the first direction, and so that each interconnection spans the center line, wherein the semiconductor substrate has a light receiving surface side defined on the principal face side, a mounting member on which the solid-state image pickup element is mounted and in which a plurality of third electrode pads are arranged on a principal face thereof, wherein the solid-state image pickup element is mounted on the mounting member so that the back face to the principal face of the solid-state image pickup element is opposite to the principal face of the mounting member, and wherein the plurality of first electrode pads and the plurality of third electrode pads are connected by wire bonding.

8. The solid-state image pickup element mounting structure according to claim 7, wherein the plurality of first electrode pads are located nearer to said one side of the semiconductor substrate than the plurality of second electrode pads.

9. A solid-state image pickup element mounting structure comprising:

a solid-state image pickup element comprising:
a semiconductor substrate of a rectangular shape having a photosensitive region, a CCD being formed as pixels in the photosensitive region;
a plurality of first electrode pads linearly disposed in a first array on a principal face of the semiconductor substrate and symmetrically distributed about a center line of the first array;
a plurality of second electrode pads linearly disposed in a second array parallel to the first array on the principal face of the semiconductor substrate and symmetrically distributed about the center line;
a plurality of interconnections connecting the plurality of first electrode pads and the plurality of second electrode pads in one-to-one correspondence, and
wherein the plurality of interconnections connect the first and second electrode pads so that each interconnection connects the first electrode pad and the second electrode pad in an identical order relation in an array order in a first direction and in an array order in a second direction opposite to the first direction, and so that each interconnection spans the center line, wherein the semiconductor substrate has a light receiving surface side defined on the back face side to the principal face, a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to the principal face of the mounting member, and wherein the plurality of second electrode pads and the plurality of third electrode pads are connected by flip chip bonding.

10. The solid-state image pickup element mounting structure according to claim 9, wherein the plurality of first electrode pads are located nearer to said one side of the semiconductor substrate than the plurality of second electrode pads.

11. A solid-state image pickup element mounting structure comprising:

a solid-state image pickup element comprising:

a semiconductor substrate of a rectangular shape having a photosensitive region, a CCD being formed as pixels in the photosensitive region;

a plurality of first electrode pads linearly disposed in a first array on a principal face of the semiconductor substrate and symmetrically distributed about a center line of the first array;

a plurality of second electrode pads linearly disposed in a second array parallel to the first array on the principal face of the semiconductor substrate and symmetrically distributed about the center line;

a plurality of interconnections connecting the plurality of first electrode pads and the plurality of second electrode pads in one-to-one correspondence, and wherein the plurality of interconnections connect the first and second electrode pads so that each interconnection connects the first electrode pad and the second electrode pad in an identical order relation in an array order in a first direction and in an array order in a second direction opposite to the first direction, and so that each interconnection spans the center line, wherein the semiconductor substrate has a light receiving surface side defined on the back face side to the principal face, a mounting member on which the solid-state image pickup element is mounted and in which a plurality of third electrode pads are arranged on a principal face thereof, wherein the solid-state image pickup element is mounted on the mounting member so that the principal face of the solid-state image pickup element is opposite to a back face to the principal face of the mounting member, and wherein the plurality of second electrode pads and the plurality of third electrode pads are connected by wire bonding.

12. The solid-stale image pickup element mounting structure according to claim 11, wherein the plurality of first electrode pads are located nearer to said one side of the semiconductor substrate than the plurality of second electrode pads.

* * * * *